(12) United States Patent
Yonekubo

(10) Patent No.: US 8,092,028 B2
(45) Date of Patent: Jan. 10, 2012

(54) LIGHT SOURCE, AND IMAGE DISPLAY APPARATUS, MONITORING APPARATUS, AND ILLUMINATION APPARATUS USING THE SAME

(75) Inventor: Masatoshi Yonekubo, Hara-mura (JP)

(73) Assignee: Seiko Epson Corporation, Tokyo (JP)

(*) Notice: Subject to any disclaimer, the term of this patent is extended or adjusted under 35 U.S.C. 154(b) by 505 days.

(21) Appl. No.: 12/082,167

(22) Filed: Apr. 9, 2008

(65) Prior Publication Data
US 2008/0253412 A1    Oct. 16, 2008

(30) Foreign Application Priority Data

Apr. 10, 2007 (JP) ................................. 2007-102324

(51) Int. Cl.
*G02B 27/12* (2006.01)
*H01S 3/08* (2006.01)
(52) U.S. Cl. .......... 353/81; 353/102; 359/639; 359/235
(58) Field of Classification Search ............... 353/81, 353/102, 31, 33, 34, 37; 359/204.1–204.4, 359/211.2, 636, 639, 640, 235; 362/553, 362/561, 230, 233, 239, 244, 234, 235; 372/26, 372/9; 349/5, 7, 8, 9
See application file for complete search history.

(56) References Cited

U.S. PATENT DOCUMENTS

| | | | | |
|---|---|---|---|---|
| 6,240,116 B1 * | 5/2001 | Lang et al. | | 372/50.12 |
| 6,301,054 B1 * | 10/2001 | Van Tran | | 359/639 |
| 6,400,512 B1 * | 6/2002 | Hildebrandt | | 359/639 |
| 6,493,148 B1 * | 12/2002 | Anikitchev | | 359/634 |
| 7,222,974 B2 * | 5/2007 | Tomita | | 353/94 |
| 7,384,159 B2 * | 6/2008 | Takeda | | 353/94 |
| 7,387,390 B2 * | 6/2008 | Zhang | | 353/31 |
| 7,764,724 B2 * | 7/2010 | Peterson | | 372/108 |
| 7,810,931 B2 | 10/2010 | Kawamura et al. | | |

(Continued)

FOREIGN PATENT DOCUMENTS

JP        5-013297        1/1993

(Continued)

OTHER PUBLICATIONS

A. Mooradian et al., "High Power Extended Vertical Cavity Surface Emitting Diode Lasers and Arrays and their Applications," Micro-Optics Conference, Nov. 2, 2005, pp. 1-4, Tokyo.

*Primary Examiner* — William C Dowling
(74) *Attorney, Agent, or Firm* — AdvantEdge Law Group, LLC

(57) ABSTRACT

A light source that emits light includes light source units, each emitting a plurality of light beams parallel to one another, the plurality of light beams including first and second light beams, and a beam distance adjustment element that is an optical element made of a light-transmissive material. The beam distance adjustment element is configured to adjust the distance between the first and second light beams. The beam distance adjustment element includes a first incidence plane on which the first light beam is incident, a first exit plane that is parallel to the first incidence plane and from which the first light beam exits, a second incidence plane on which the second light beam is incident, and a second exit plane that is parallel to the second incidence plane and from which the second light beam exits. The first and second light beams intersect in the beam distance adjustment element.

10 Claims, 6 Drawing Sheets

| U.S. PATENT DOCUMENTS | | | |
|---|---|---|---|
| 2004/0252743 A1 * | 12/2004 | Anikitchev et al. | 372/97 |
| 2006/0023173 A1 | 2/2006 | Mooradian et al. | |
| 2006/0023757 A1 | 2/2006 | Mooradian et al. | |
| 2006/0268241 A1 | 11/2006 | Watson et al. | |
| 2006/0280219 A1 | 12/2006 | Shchegrov | |
| 2007/0153862 A1 | 7/2007 | Shchegrov et al. | |
| 2007/0153866 A1 | 7/2007 | Shchegrov et al. | |

| FOREIGN PATENT DOCUMENTS | | |
|---|---|---|
| JP | 06-331939 A | 12/1994 |
| JP | 9-021972 | 1/1997 |
| JP | 10-282441 A | 10/1998 |
| JP | 2004-086019 | 3/2004 |
| JP | 2007-058163 A | 3/2007 |

* cited by examiner

MONITORING APPARATUS

LIGHT SOURCE, AND IMAGE DISPLAY APPARATUS, MONITORING APPARATUS, AND ILLUMINATION APPARATUS USING THE SAME

CROSS REFERENCE TO RELATED APPLICATIONS

The present application claims priority and incorporates by reference in its entirety Japanese Patent Application No. 2007-102324 filed Apr. 10, 2007.

BACKGROUND

A laser array light source unit that emits a plurality of laser beams may be used as a light source. Further, as a method for adjusting the beam-to-beam distances between a plurality of laser beams, at least one of the adjustment methods using a combination of a plurality of optical lenses as referred to in Japanese Patent Publication No. JP-A-2004-86019, Japanese Patent Publication No. JP-A-9-21972, and Japanese Patent Publication No. JP-A-5-13297 may be used.

However, when a plurality of optical lenses are combined and used as described in the above identified methods, the characteristics of each optical lens need to be close to specified values and the optical lenses need to be assembled in a highly accurate manner. For example, existing technology configurations often face the difficult task of adjusting the beam-to-beam distance with sufficient accuracy; often these adjustments are as small as 1 mm or smaller. Further, the use of a plurality of optical lenses may increase the size of the laser light source. Such difficulties not only occur where a plurality of laser beams are used, but also commonly occur where a plurality of light beams are used.

SUMMARY

Various embodiments provide a technology in which a simple configuration is used to adjust the distances between a plurality of light beams.

A device according to one embodiment includes light source units, each emitting a plurality of light beams parallel to one another, the plurality of light beams including first and second light beams, and a beam distance adjustment element that is an optical element made of a light-transmissive material, the beam distance adjustment element adjusting the distance between the first and second light beams. The beam distance adjustment element includes a first incidence plane on which the first light beam is incident, a first exit plane that is parallel to the first incidence plane and from which the first light beam exits, a second incidence plane on which the second light beam is incident, and a second exit plane that is parallel to the second incidence plane and from which the second light beam exits. The first and second light beams intersect in the beam distance adjustment element.

According to one embodiment, the first and second light beams emitted from the light source units parallel to each other are refracted twice when they pass through the beam distance adjustment element, so that the refracted first and second light beams travel in shifted directions and intersect each other in the element. The beam distance adjustment element may thus change the distance between the first and second light beams.

In one embodiment, the distance between the first and second light beams after exiting exited from the beam distance adjustment element is smaller than the distance between the first and second light beams before entering the beam distance adjustment element.

In one embodiment, the distance between the first and second light beams after exiting from the beam distance adjustment element is greater than the distance between the first and second light beams before entering the beam distance adjustment element.

In one embodiment, the distance between the first and second light beams after exiting from the beam distance adjustment element is equal to the distance between the first and second light beams before entering the beam distance adjustment element.

In one embodiment, the cross-sectional shape of the beam distance adjustment element in a plane including the light paths of the first and second light beams is a parallelogram or a parallelogram in which part of the area that does not include the light paths of the first and second light beams is truncated.

According to one embodiment, the beam distance adjustment element may be formed as a single three-dimensional object.

Embodiments may be implemented in various forms. For example, one embodiment may be embodied as a light source. Embodiments of the light source may also be incorporated into an illumination apparatus, an image display apparatus, and a monitoring apparatus.

BRIEF DESCRIPTION OF THE DRAWINGS

Embodiments are described with reference to the accompanying drawings, wherein like reference numbers designate like elements.

DETAILED DESCRIPTION OF EXEMPLARY EMBODIMENTS

In the following detailed description, reference is made to the accompanying drawings which form a part hereof wherein like numerals designate like parts throughout, and in which are shown, by way of illustration, specific embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of the present disclosure is defined by the appended claims and their equivalents.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. Reference in the specification to "one embodiment" or "an embodiment" means that a particular feature, structure, or characteristic described in connection with the embodiment is included in at least one embodiment of the disclosure. The meaning of "in" may include "in" and "on." The appearances of the phrases "in one embodiment" or "in an embodiment" in various places in the specification do not necessarily all refer to the same embodiment, but it may. Several embodiments will sequentially be described under corresponding section headings below. Section headings are merely employed to improve readability, and they are not to be construed to restrict or narrow the present disclosure. For example, the order of description headings should not necessarily be construed so as to imply that these operations are necessarily order dependent or to imply the relative importance of an embodiment.

A. Projection Display Apparatus

Figure 1:
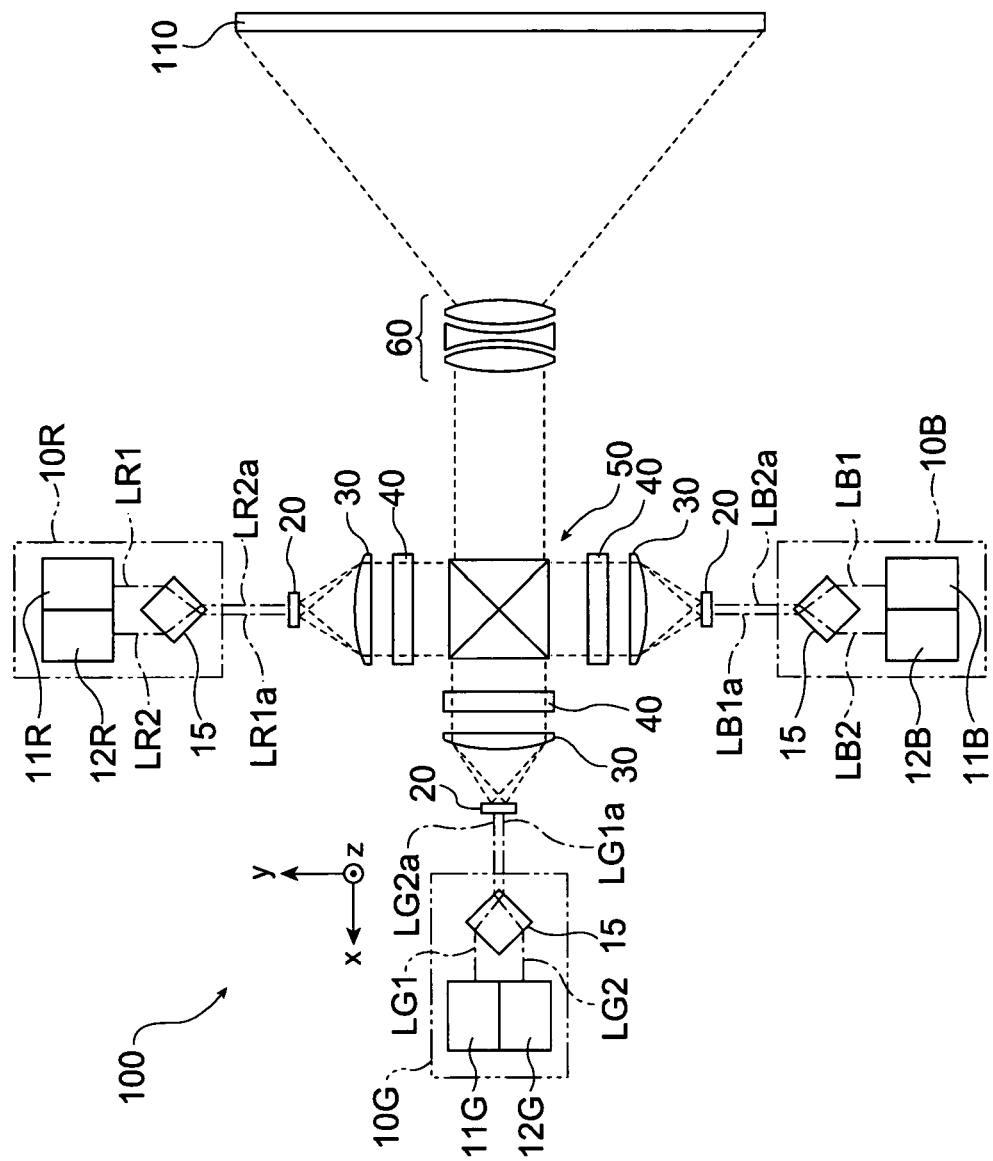
FIG. 1 is a schematic view showing the configuration of a projection display apparatus according to one embodiment of the present disclosure.

FIG. 1 is a schematic view showing the configuration of a projection display apparatus according to one embodiment of the disclosure. The projection display apparatus 100 may display a color image by projecting image light modulated according to an image signal onto a projection screen 110. In FIG. 1, the upward and leftward directions in the plane of view are the y and x axes, respectively, and the upward direction perpendicular to the plane of view is the z axis.

The projection display apparatus 100 includes three laser light sources 10R, 10G, and 10B that emit three color component light beams of red, green, and blue, respectively. The green laser light source 10G includes two laser array light source units 11G and 12G, one stacked on the other, and a beam distance adjustment element 15. The two laser array light source units 11G and 12G may emit green laser beams LG1 and LG2, respectively. The first and second laser beams LG1 and LG2 are parallel to each other. The beam distance adjustment element 15, on which the first and second laser beams LG1 and LG2 are incident, outputs laser beams LG1a and LG2a parallel to each other, which have a beam-to-beam distance adjusted to a smaller value while maintaining the beam traveling direction.

Similarly, the red and blue laser light sources 10R and 10B include two laser array light source units for each of the respective colors, 11R, 12R and 11B, 12B, and one beam distance adjustment element 15 for each of the respective colors. The two red laser array light source units 11R and 12R emit first and second red laser beams LR1 and LR2, respectively, and the two blue laser array light source units 11B and 12B emit first and second blue laser beams LB1 and LB2, respectively. First and second laser beams LR1a, LR2a, and LB1a, LB2a, whose beam-to-beam distances are adjusted to smaller values, are outputted from the corresponding beam distance adjustment elements 15.

Figure 2:
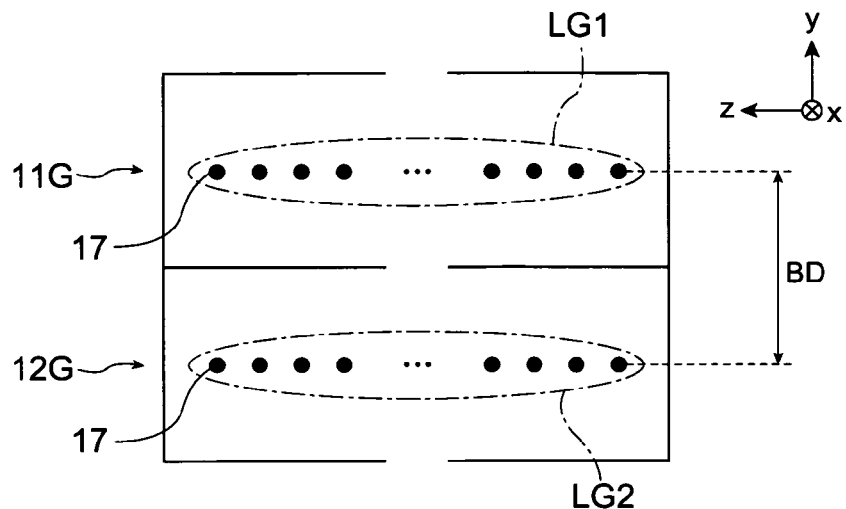
FIG. 2 is a diagram showing a laser array light source unit according to various embodiments of the present disclosure.

FIG. 2 is a schematic view showing the light exit plane of the two green laser array light source units 11G and 12G, which is a front view thereof obtained by viewing them toward the x axis direction shown in FIG. 1. Each of the two laser array light source units 11G and 12G has a plurality of laser beam exit holes 17 aligned and evenly spaced apart. That is, each of the first and second laser beams LG1 and LG2 may be formed of a row of a plurality of laser beams parallel to one another, aligned and evenly spaced apart. When the first and second laser beams LG1 and LG2 exit, they are separated by a distance BD. The two red laser array light source units 11R, 12R and the two blue laser array light source units 11B, 12B are configured in the same manner.

Figure 3A:
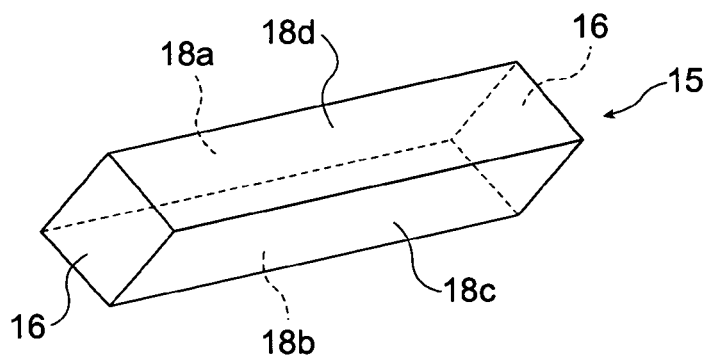
FIG. 3A is a schematic perspective view and FIG. 3B is a diagram showing a beam distance adjustment element.

FIG. 3A is a schematic perspective view showing the configuration of the beam distance adjustment element 15. The beam distance adjustment element 15 may be shaped into a square prism, the bottom 16 of which may be a square, and includes four side surfaces 18a, 18b, 18c, and 18d. The beam distance adjustment element 15 may be made of optical glass or the like. The beam distance adjustment element 15 preferably has a refractive index adjusted according to the wavelength of incident color laser light (laser beam).

Figure 3B:
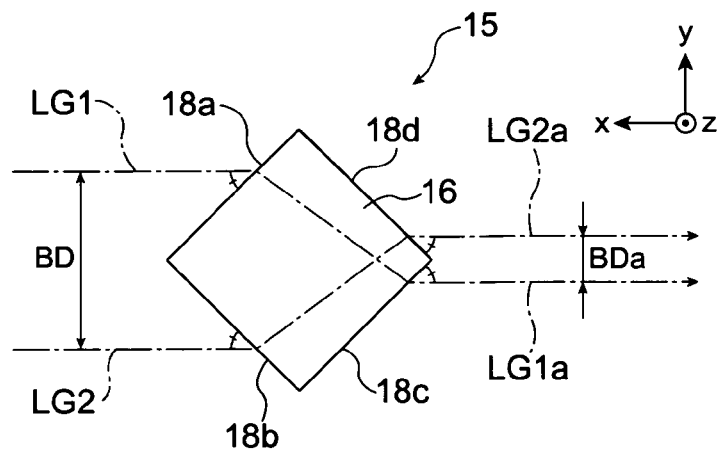

FIG. 3B is a diagrammatic view showing the path of the laser light incident on the beam distance adjustment element 15. FIG. 3B shows the beam distance adjustment element 15, the bottom 16 of which faces the front. As shown in FIG. 3B, the first laser beam LG1 may be incident on the side surface 18a (hereinafter referred to as "incidence plane 18a") of the beam distance adjustment element 15. The incident first laser beam LG1 may be refracted and then exits as the first laser beam LG1a from the side surface 18c (hereinafter referred to as "exit plane 18c"), which faces the incident side surface 18a. Since the two side surfaces 18a and 18c are parallel to each other, the incident first laser beam LG1 and the exiting first laser beam LG1a have the same traveling direction.

The second laser beam LG2 may be incident on the side surface 18b (hereinafter referred to as "incidence plane 18b"), which may be adjacent to the side surface 18a, on which the first laser beam LG1 may be incident. The incident second laser beam LG2 may be refracted and then exits as the second laser beam LG2a from the side surface 18d (hereinafter referred to as "exit plane 18d"), which faces the incident side surface 18b. The second laser beam LG2 intersects the first laser beam LG1 in the beam distance adjustment element 15. In the example shown in FIG. 3B, the beam-to-beam distance between the first and second laser beams LG1a and LG2a is BDa, which may be smaller than the beam-to-beam distance BD between the first and second laser beams LG1 and LG2.

The laser beam that passes through the beam distance adjustment element 15 exits from the exit plane at various positions according to the position at which the laser beam may be incident on the incidence plane and the refractive index of the beam distance adjustment element 15. Therefore, by adjusting the incident positions of the first and second laser beams LG1 and LG2 and the refractive index of the beam distance adjustment element 15, the distance between the beams that have exited may be adjusted. The same thing applies to the laser beams of the other component light.

The projection display apparatus 100 shown in FIG. 1 further includes diffuser elements 20, convex lenses 30, and liquid crystal panels 40R, 40G, and 40B for the light of respective color components. The first and second laser beams LR1a, LR2a, LG1a, LG2a, LB1a, and LB2a emitted from the three laser light sources 10R, 10G, and 10B are incident on the diffuser elements 20 for the respective colors.

The diffuser element 20 produces a uniform intensity distribution of the light to be incident on each of the liquid crystal panels 40R, 40G, and 40B, which will be described later. Examples of the diffuser element 20 may be a lens array and a hologram element. The convex lens 30 converts the light that has exited from the diffuser element 20 into collimated light.

Each of the liquid crystal panels 40R, 40G, and 40B for red, green, and blue modulates the corresponding color component light according to an image signal from a controller (not shown) and outputs image light representing the image. Each of the liquid crystal panels 40R, 40G, and 40B may include polarizers on the light incident side and the light exiting side so that the outputted image light has a predetermined linearly polarized component.

Figure 4:
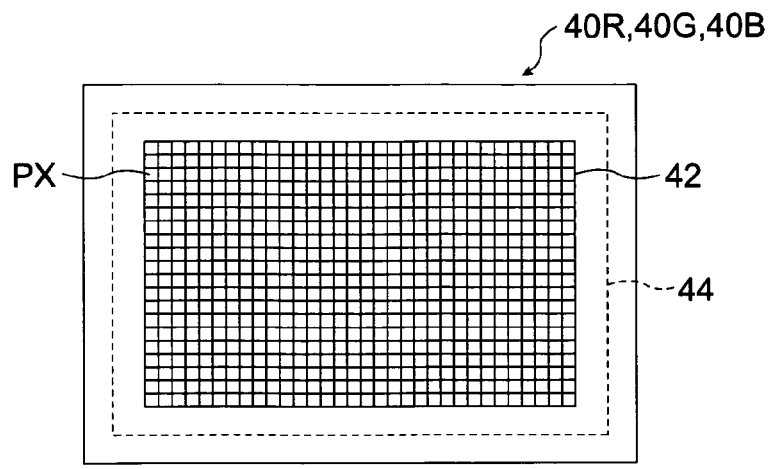
FIG. 4 is a schematic view showing a liquid crystal panel.

FIG. 4 is a schematic view showing the light incidence plane side of each of the liquid crystal panels 40R, 40G, and 40B for respective colors. Each of the liquid crystal panels 40R, 40G, and 40B has a light incidence plane 42 on which the light to be modulated may be incident. The light incidence plane 42 has an area containing an incidence plane for a plurality of pixels PX, each of which performs modulation. The shape of the area may be typically rectangular. The diffuser element 20 and the convex lens 30 serve to convert the light beam that has exited from the beam distance adjustment element 15 into illumination light that illuminates an illumination area 44 of the liquid crystal panel that contains the light incidence plane 42. The illumination light preferably illuminates the light incidence plane 42 in a uniform manner. Any differently configured optical system may be employed to convert the light beam emitted from the light source into the illumination light that illuminates the illumination area of the liquid crystal panel.

The projection display apparatus 100 further includes a cross dichroic prism 50 and a projection lens 60. The image light beams having respective color components that have exited from the liquid crystal panels 40R, 40G, and 40B for respective colors are incident on the corresponding side surfaces of the cross dichroic prism 50, combined therein, and outputted as combined image light. The combined image light outputted from the cross dichroic prism 50 may be projected through the projection lens 60 onto the projection screen 110.

According to the configuration of this embodiment, since the beam distance adjustment element 15 has adjusted the beam-to-beam distances between the first and second color laser beams LR1a, LR2a, LG1a, LG2a, LB1a, and LB2a to small values, the diffuser elements 20 may be reduced in size accordingly. Further, since the beam distance adjustment element 15 may adjust the distance between the beams that exit therefrom by changing the refractive index thereof and the positions where the laser beams are incident as described above, the beam-to-beam distance between the laser beams may easily be adjusted with precision.

Figure 5A:
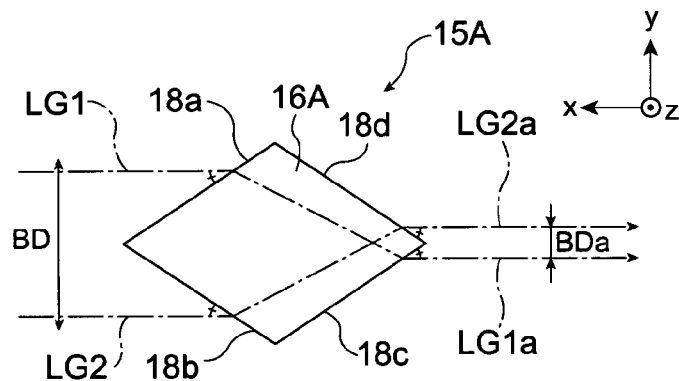
FIGS. 5A and 5B are schematic views showing the cross-sectional shape of the beam distance adjustment element according to various embodiments of the present disclosure.
Figure 5B:
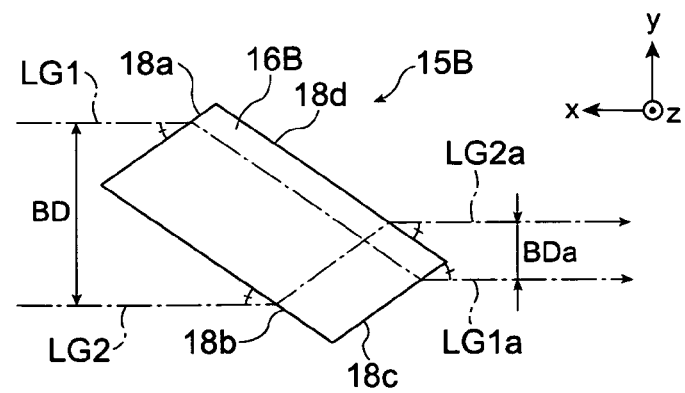

FIGS. 5A and 5B are schematic views showing another example of the cross-sectional shape of the beam distance adjustment element, also showing the laser beam path as in FIG. 3B. A beam distance adjustment element 15A shown in FIG. 5A may be similar to the beam distance adjustment element 15 described with reference to FIGS. 3A and 3B except that the beam distance adjustment element 15A may be shaped into a substantially rectangular prism, the bottom 16A of which may be a rhomboid. A beam distance adjustment element 15B shown in FIG. 5B may be similar to the beam distance adjustment element 15 described with reference to FIGS. 3A and 3B except that the beam distance adjustment element 15B may be shaped into a substantially rectangular prism, the bottom 16B of which may be a parallelogram. These configurations also allow adjustment of the distance between incident laser beams parallel to each other. Further, in the configuration shown in FIG. 5B, the first and second laser beams may be outputted in such a way that the center of the first and second laser beams as a whole after they have exited may be shifted from that before they are incident.

Figure 6A:
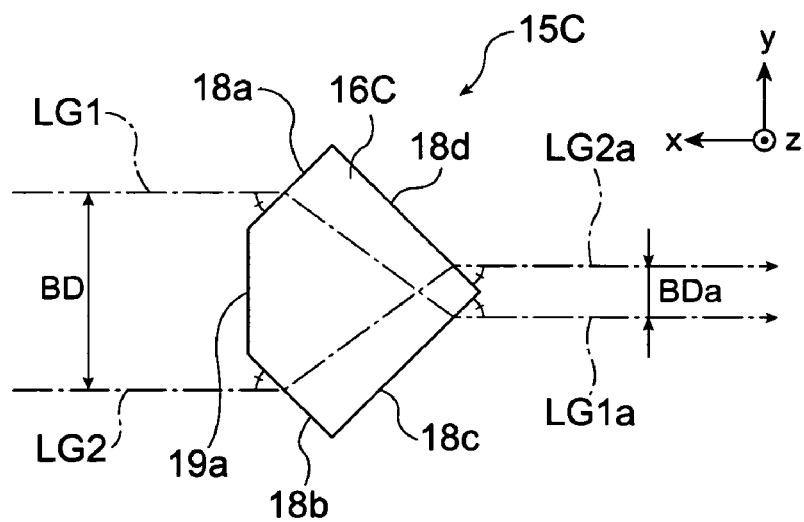
FIGS. 6A and 6B are schematic views showing the cross-sectional shape of the beam distance adjustment element according to various embodiments of the present disclosure.
Figure 6B:
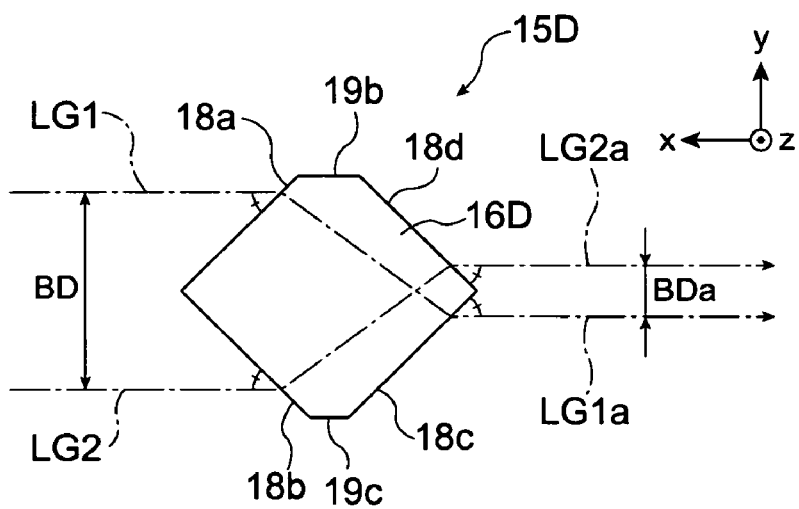

FIGS. 6A and 6B are schematic views showing still another example of the cross-sectional shape of the beam distance adjustment element. The beam distance adjustment elements 15C and 15D shown in FIGS. 6A and 6B are similar to the beam distance adjustment element 15 described with reference to FIGS. 3A and 3B except that part of the shape of the bottom of each of the beam distance adjustment elements may be truncated. Specifically, the beam distance adjustment element 15C shown in FIG. 6A has not only the two incidence planes 18a and 18b and the two exit planes 18c and 18d but also a side surface 19a on the laser beam incident side. The bottom 16C of the beam distance adjustment element 15C thus has a substantially pentagonal shape. The beam distance adjustment element 15D shown in FIG. 6B has a side surface 19b adjacent to the first incidence plane 18a and the second exit plane 18d as well as a side surface 19c adjacent to the second incidence plane 18b and the first exit plane 18c. The bottom 16D of the beam distance adjustment element 15D thus has a substantially hexagonal shape.

As shown in FIGS. 6A and 6B, part of the cross-sectional shape of the beam distance adjustment element may be truncated as long as the truncated portion does not contain the laser beam path. By thus truncating an unnecessary portion, the beam distance adjustment element may be reduced in size and weight.

As will be understood from the above description, the beam distance adjustment element may be variously shaped as long as the element has first and second incidence planes on which first and second light beams parallel to each other are incident and first and second exit planes parallel to the first and second incidence planes, respectively, and the first and second light beams intersect in the element.

B. Monitoring Apparatus

Figure 7:
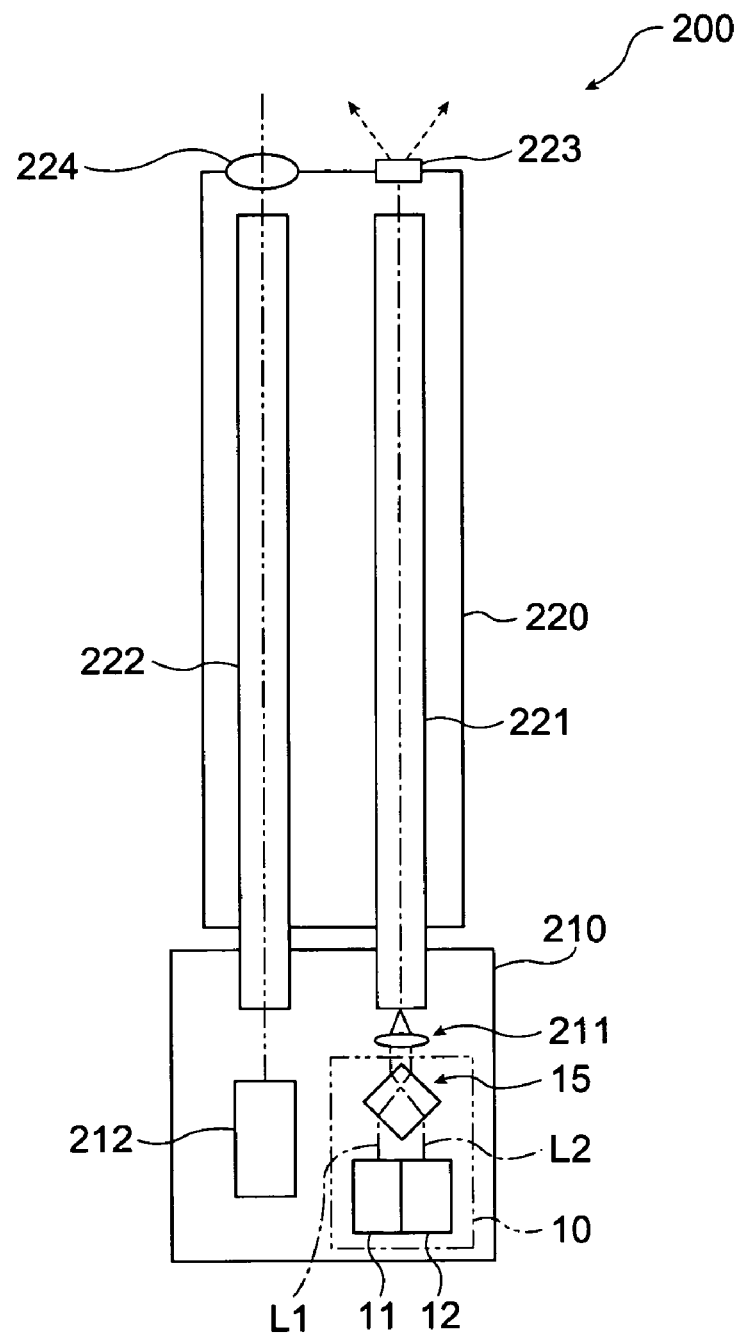
FIG. 7 is a schematic view showing the configuration of a monitoring apparatus according to various embodiments of the present disclosure.

FIG. 7 is a schematic view showing the configuration of a monitoring apparatus according to one embodiment of the disclosure. The monitoring apparatus 200 includes an apparatus body 210 and a light transmitter 220. The apparatus body 210 includes a light source 10, a collector lens 211, and a camera 212.

The light source 10 includes two laser array light source units 11 and 12, and a beam distance adjustment element 15. The two laser array light source units 11 and 12 are similar to the two laser array light source units 11R/12R, 11G/12G, and 11B/12B described in the first embodiment except that the laser array light source units 11 and 12 emit first and second laser beams L1 and L2, each of which may not be color component light but white light. The beam distance adjustment element 15 may be the same as that described in the first embodiment and adjusts the beam-to-beam distance between the first and second laser beams L1 and L2.

The light transmitter 220 includes two light guides 221 and 222, a diffuser plate 223, and an imaging lens 224. Each of the two light guides 221 and 222 transmits light to a remote location and may be formed of a large number of bundled optical fibers. The first lightguide 221 transmits the light for illuminating a subject. The second lightguide 222 transmits the light reflected off the subject to the camera 212. The diffuser plate 223 may be an element that may diffuse the incident light beam and output it. The diffuser plate 223 may be disposed on the light exiting side of the first lightguide 221, and the imaging lens 224 may be disposed on the light incident side of the second lightguide 222.

The light incident side of the first lightguide 221 and the light exiting side of the second lightguide 222 are connected to the apparatus body 210. The collector lens 211 and the laser light source 10 are disposed on the light incident side of the first lightguide 221 in the apparatus body 210. The camera 212 may be disposed on the light exiting side of the second lightguide 222 in the apparatus body 210.

The laser light emitted from the laser light source 10 may be collected by the collector lens 211, incident on the diffuser 223 through the first lightguide 221, diffused by the diffuser plate 223, and applied to a subject. The light reflected off the subject enters the imaging lens 224, and passes through the second lightguide 222 to the camera 212. In this way, the camera 212 may acquire an image of the subject by using the laser light emitted from the laser light source 10 as illumination light.

Since the laser light source 10 used in the monitoring apparatus 200 includes the beam distance adjustment element 15, the distance between the laser light beams emitted from the two laser array light source units 11 and 12 may be adjusted to a small value. The diameter of the collector lens 211 may thus be reduced. Further, since the angle of incidence at which the light impinges on the first lightguide 221 may be reduced, the laser light may be transmitted to the subject in a more reliable manner even when the numerical aperture (NA) of the first lightguide 221 may be small.

C. Illumination Apparatus

Figure 8:
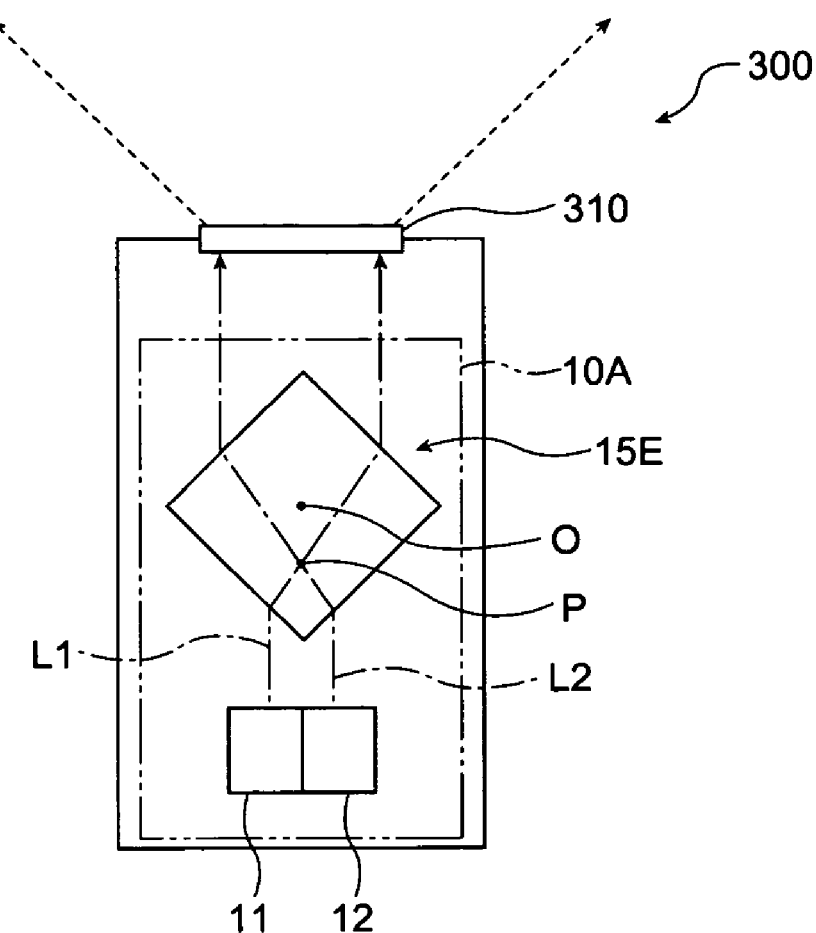
FIG. 8 is a schematic view showing the configuration of an illumination apparatus according to various embodiments of the present disclosure.

FIG. 8 is a schematic view showing the configuration of an illumination apparatus according to one embodiment of the disclosure. The illumination apparatus 300 includes a laser light source 10A and a diffuser element 310. The laser light source 10A includes two laser array light source units 11 and 12 and a beam distance adjustment element 15E. The two laser array light source units 11 and 12 are the same as those described in the second embodiment.

The beam distance adjustment element 15E may be large enough for the distance between the first and second laser beams L1 and L2 emitted from the two laser array light source units 11 and 12, and the two laser beams L1 and L2 have a larger beam-to-beam distance after they exit from the beam distance adjustment element 15E. Specifically, when the bottom of the beam distance adjustment element 15E may be square or rhomboid in shape, and the intersection P of the two incident laser beams L1 and L2 may be located upstream of the center 0 of the bottom of the beam distance adjustment element 15E, the beam-to-beam distance becomes larger.

The laser beams L1 and L2 emitted from the two laser array light source units 11 and 12 pass through the beam distance adjustment element 15E, where the beam-to-beam distance becomes larger, enter the diffuser element 310, and exit therefrom as diffused illumination light. The use of the light source 10A may thus allow construction of an illumination apparatus that may illuminate an area larger than the size of the two laser array light source units 11 and 12.

D. Modifications

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. The disclosure is not limited to the above examples and embodiments, but may be implemented in various aspects to the extent that they do not depart from the spirit of the disclosure. Those with skill in the art will readily appreciate that embodiments in accordance with the present disclosure may be implemented in a very wide variety of ways. For example, the following modifications are possible.

Although in the above embodiments, the laser array light source unit that emits laser beams is used as the light source, a light source unit that emits other light beams, such as a light emitting diode unit, may be used. Further, although in the above embodiments, two light source units, one stacked on the other, are used, a single light source unit may be used in one embodiment. In certain embodiments, the light source unit may have any other configuration as long as it emits at least two light beams parallel to each other.

Although in previously described embodiments, the beam distance adjustment element is used to reduce the distance between the first and second laser beams, the distance may also be increased or remain the same. Although in one embodiment, the beam distance adjustment element is used to increase the distance between the first and second laser beams, the distance may alternatively be reduced or remain the same.

Although in the above embodiments, one beam distance adjustment element is used for each light source, two or more beam distance adjustment elements may also be used.

This application is intended to cover any adaptations or variations of the embodiments discussed herein. Therefore, it is manifestly intended that embodiments in accordance with the present disclosure be limited only by the claims and the equivalents thereof.

What is claimed is:

1. A light source that emits light, comprising:
a first laser array light source unit configured to emit a plurality of first light beams from a plurality of first laser beam exit holes that are aligned linearly in an alignment direction;
a second laser array light source unit configured to emit a plurality of second light beams from a plurality of second laser beam exit holes that are aligned linearly in the alignment direction, the plurality of first light beams and the plurality of second light beams being emitted parallel to each other;
a beam distance adjustment element configured to intersect the plurality of first light beams and the plurality of second light beams in the beam distance adjustment element and to adjust the distance between the plurality of first light beams and the plurality of second light beams, the beam distance adjustment element having:
an optical element made of a light-transmissive material,
a first incidence plane on which the plurality of first light beams is incident, the first incidence plane extending in the alignment direction,
a first exit plane that is parallel to the first incidence plane and from which the plurality of first light beams exits,
a second incidence plane on which the plurality of second light beams is incident, the second incidence plane extending in the alignment direction, and
a second exit plane parallel to the second incidence plane from which the plurality of second light beams exits,
wherein:
the cross-sectional shape of the beam distance adjustment element is a parallelogram,
a width of the second incidence plane from a corner of the parallelogram at an intersection of the first incidence plane and the second incidence plane to a corner of the parallelogram at an intersection of the second incidence plane and the first exit plane is greater than a width of the first incidence plane from the corner of the parallelogram at the intersection of the first incidence plane and the second incidence plane to a corner of the parallelogram at an intersection of the first incidence plane and the second exit plane, and
a distance between the plurality of second light beams incident on the second incidence plane and the corner of the parallelogram at the intersection of the first incidence plane and the second incidence plane is greater than a distance between the plurality of first light beams incident on the first incidence plane and the corner of the parallelogram at the intersection of the first incidence plane and the second incidence plane.

2. The light source according to claim 1, wherein the distance between the plurality of first light beams and the plurality of second light beams after exiting from the beam distance adjustment element is smaller than the distance between the plurality of first light beams and the plurality of second light beams before entering the beam distance adjustment element.

3. The light source according to claim 1, wherein the distance between the plurality of first light beams and the plurality of second light beams after exiting from the beam distance adjustment element is greater than the distance between the plurality of first light beams and the plurality of second light beams before entering the beam distance adjustment element.

4. An image display apparatus comprising a light source according to claim 1.

5. A monitoring device comprising a light source according to claim 1.

6. An illumination device comprising a light source according to claim 1.

7. An image display apparatus comprising:
   a light source configured to emit light, the light source having a first laser array light source unit and a second laser array light source unit, the first laser array light source unit configured to emit a plurality of first light beams from a plurality of first laser beam exit holes that are aligned linearly in an alignment direction and the second laser array light source unit configured to emit a plurality of second light beams from a plurality of second laser beam exit holes that are aligned linearly in the alignment direction, the plurality of first light beams and the plurality of second light beams being emitted parallel to each other, and a beam distance adjustment element, the beam distance adjustment element configured to intersect the plurality of first light beams and the plurality of second light beams in the beam distance adjustment element and to adjust the distance between the plurality of first light beams and the plurality of second light beams;
   a light modulator having a light incidence plane that receives incident light, the light modulator modulating the light incident on the light incidence plane according to an image signal to produce image light;
   an illumination light conversion optical element that converts the plurality of first light beams and the plurality of second light beams emitted from the light source into illumination light that illuminates an illumination area including the light incidence plane of the light modulator; and
   a projection system that projects the image light modulated by the light modulator,
   wherein:
      the beam distance adjustment element includes:
         an optical element made of a light-transmissive material,
         a first incidence plane on which the plurality of first light beams is incident, the first incidence plane extending in the alignment direction,
         a first exit plane that is parallel to the first incidence plane and from which the plurality of first light beams exits,
         a second incidence plane on which the plurality of second light beams is incident, the second incidence plane extending in the alignment direction, and
         a second exit plane parallel to the second incidence plane from which the plurality of second light beams exits,
      the cross-sectional shape of the beam distance adjustment element is a parallelogram,
      a width of the second incidence plane from a corner of the parallelogram at an intersection of the first incidence plane and the second incidence plane to a corner of the parallelogram at an intersection of the second incidence plane and the first exit plane is greater than a width of the first incidence plane from the corner of the parallelogram at the intersection of the first incidence plane and the second incidence plane to a corner of the parallelogram at an intersection of the first incidence plane and the second exit plane, and
      a distance between the plurality of second light beams incident on the second incidence plane and the corner of the parallelogram at the intersection of the first incidence plane and the second incidence plane is greater than a distance between the plurality of first light beams incident on the first incidence plane and the corner of the parallelogram at the intersection of the first incidence plane and the second incidence plane.

8. A monitoring apparatus comprising:
   a light source configured to emit light, the light source having a first laser array light source unit and a second laser array light source unit, the first laser array light source unit configured to emit a plurality of first light beams from a plurality of first laser beam exit holes that are aligned linearly in an alignment direction and the second laser array light source unit configured to emit a plurality of second light beams from a plurality of second laser beam exit holes that are aligned linearly in the alignment direction, the plurality of first light beams and the plurality of second light beams being emitted parallel to each other, and a beam distance adjustment element, the beam distance adjustment element configured to intersect the plurality of first light beams and the plurality of second light beams in the beam distance adjustment element and to adjust the distance between the plurality of first light beams and the plurality of second light beams;
   an imager that images a subject; and
   an illumination light conversion optical element that converts the plurality of first light beams and the plurality of second light beams emitted from the light source into illumination light that illuminates the subject,
   wherein:
      the beam distance adjustment element includes:
         an optical element made of a light-transmissive material,
         a first incidence plane on which the plurality of first light beams is incident, the first incidence plane extending in the alignment direction,
         a first exit plane that is parallel to the first incidence plane and from which the plurality of first light beams exits,
         a second incidence plane on which the plurality of second light beams is incident, the second incidence plane extending in the alignment direction, and a second exit plane parallel to the second incidence plane from which the plurality of second light beams exits, the cross-sectional shape of the beam distance adjustment element is a parallelogram, a width of the second incidence plane from a corner of the parallelogram at an intersection of the first incidence plane and the second incidence plane to a corner of the parallelogram at an intersection of the second incidence plane and the first exit plane is greater than a width of the first incidence plane from the corner of the parallelogram at the intersection of the first incidence plane and the second incidence plane to a corner of the parallelogram at an intersection of the first incidence plane and the second exit plane, and a distance between the plurality of second light beams incident on the second incidence plane and the corner of the parallelogram at the intersection of the first incidence plane and the second incidence plane is greater than a distance between the plurality of first light beams incident on the first incidence plane and the corner of the parallelogram at the intersection of the first incidence plane and the second incidence plane.

9. An illumination apparatus comprising:
a light source configured to emit light, the light source having a first laser array light source unit and a second laser array light source unit, the first laser array light source unit configured to emit a plurality of first light beams from a plurality of first laser beam exit holes that are aligned linearly in an alignment direction and the second laser array light source unit configured to emit a plurality of second light beams from a plurality of second laser beam exit holes that are aligned linearly in the alignment direction, the plurality of first light beams and the plurality of second light beams being emitted parallel to each other, and a beam distance adjustment element, the beam distance adjustment element configured to intersect the plurality of first light beams and the plurality of second light beams in the beam distance adjustment element and to adjust the distance between the plurality of first light beams and the plurality of second light beams;

an illumination light conversion optical element that converts the plurality of first light beams and the plurality of second light beams emitted from the light source into illumination light, wherein:
the beam distance adjustment element includes:
an optical element made of a light-transmissive material, a first incidence plane on which the plurality of first light beams is incident, the first incidence plane extending in the alignment direction, a first exit plane that is parallel to the first incidence plane and from which the plurality of first light beams exits, a second incidence plane on which the plurality of second light beams is incident, the second incidence plane extending in the alignment direction, and a second exit plane parallel to the second incidence plane from which the plurality of second light beams exits, the cross-sectional shape of the beam distance adjustment element is a parallelogram, a width of the second incidence plane from a corner of the parallelogram at an intersection of the first incidence plane and the second incidence plane to a corner of the parallelogram at an intersection of the second incidence plane and the first exit plane is greater than a width of the first incidence plane from the corner of the parallelogram at the intersection of the first incidence plane and the second incidence plane to a corner of the parallelogram at an intersection of the first incidence plane and the second exit plane, and a distance between the plurality of second light beams incident on the second incidence plane and the corner of the parallelogram at the intersection of the first incidence plane and the second incidence plane is greater than a distance between the plurality of first light beams incident on the first incidence plane and the corner of the parallelogram at the intersection of the first incidence plane and the second incidence plane.

10. An image display apparatus comprising a light source according to claim 1, wherein:
an area of the second incidence plane is greater than an area of the first incidence plane.

* * * * *